United States Patent [19]

White

[11] 4,143,285
[45] Mar. 6, 1979

[54] DATA SMEAR COMPENSATION IN CHARGE-TRANSFER-DEVICE ANALOG SHIFT REGISTERS

[75] Inventor: Stanley A. White, Yorba Linda, Calif.

[73] Assignee: Rockwell International Corporation, El Segundo, Calif.

[21] Appl. No.: 728,690

[22] Filed: Oct. 1, 1976

[51] Int. Cl.² ............................................. G11C 19/28
[52] U.S. Cl. ................................ 307/221 D; 328/37; 328/167; 357/24
[58] Field of Search ....................... 307/221 C, 221 D; 357/24; 328/37, 162–165, 167

[56] References Cited

U.S. PATENT DOCUMENTS

| 3,614,636 | 10/1971 | Wendland | 328/162 |
| 3,931,510 | 1/1976 | Kmetz | 307/221 D |
| 3,983,409 | 9/1976 | Adam | 307/221 D |

Primary Examiner—John Zazworsky
Attorney, Agent, or Firm—L. Lee Humphries; H. Fredrick Hamann; Rolf M. Pitts

[57] ABSTRACT

A device for correcting charge-transfer inefficiency-induced distortion in charge-transfer-device analog shift registers. The shift register successively samples a data line of interest, a voltage reference source and a null input. A preselectively modeled filter, having a gain control input, cancels the "tail" or terminal data smear induced by the charge-coupled device, the gain of which filter is adjusted during response of the charge-coupled device to a sampled null input. Additional compensation of the shift register output is also provided for gain changes thereof and bias content.

14 Claims, 6 Drawing Figures

DATA SMEAR COMPENSATION IN CHARGE-TRANSFER-DEVICE ANALOG SHIFT REGISTERS

BACKGROUND OF THE INVENTION

The concept of the invention relates to means for improving the utility of charge-transfer-device type analog shift registers, and more particularly to apparatus for correction of charge-transfer-inefficiency induced distortion occurring in charge-transfer-device analog shift registers.

In the use of charge transfer devices as analog shift registers, it is known that data smear of the shift register response occurs. Such data smear or signal distortion is caused by charge transfer inefficiency in the charge transfer device cell, as is well known in the art, such phenomenon being discussed in the following U.S. patents:

U.S. Pat. No. 3,925,806 to Strain et al.
U.S. Pat. No. 3,868,516 to Buss
U.S. Pat. No. 3,946,248 to Buss
U.S. Pat. No. 3,963,942 to Sequin et al.
U.S. Pat No. 3,919,468 to Weimer Such references also deal variously with means for processing the CCD shift register output to variously overcome limited aspects of the data smear. For example, U.S. Pat. No. 3,925,806 to Strain et al. teaches the use of a static or fixed transversal filter for correction of signal tail smear. In other words, Strain's filter does not employ adaptively weighted gain coefficients.

U.S. Pat. Nos. 3,868,516 and 3,946,248 to Buss variously employ (1) a filter in which the taps or gain weights are modified, (2) a fixed inverse model filter approximation and (3) a regenerator inserted in a delay line to provide a preselected weighting function which is subtracted from a preceding slope output so as to achieve dispersion compensation. However, Buss does not teach the use of adaptive filtering in which the gain weightings are automatically adjusted to effect optimum compensation of signal "tail smear".

U.S. Pat. No. 3,963,942 to Sequin et al. addresses itself to clean-up of a d-c bias, but does not address itself to compensation of signal sample tail smear nor to variations in CCD signal gain. U.S. Pat. No. 3,919,468 to Weimer teaches use of a fixed tap transversal filter, rather than adaptive taps. Nor does such reference address bias compensation or compensation for gain changes.

From a review of the prior art, therefore, it is apparent that the matter of compensation for data smear due to charge transfer inefficiency has been variously approached in only a limited fashion.

SUMMARY OF THE INVENTION

By means of the concept of the subject invention, the limitations of the prior art are overcome and an integrated and more effective arrangement is provided for the fuller correction of signal distortion occurring in a sampling shift register. In a preferred embodiment of the invention there is provided in combination first means interposed with the throughput of the shift register for compensatorily adjusting the signal level thereof in response to the sample variations in the response thereof to a periodically injected signal reference source. There is also provided second means for compensatorily biasing the throughput of said shift register in response to sampled variations in the response thereof to a periodically nulling of the input of said shift register. There is further provided third means, adapted to be interposed at said output of said shift register, and comprising one of a recursive and transversal type network having a gated gain control input periodically coupled to the output of said shift register during the response thereof to the null signal reference for compensatorily signal tail cancelling of the output of said shift register.

By means of such arrangement, compensation of data smear is effected, and independent signal bias content and device gain variations overcome, whereby improved signal performance is obtained from the shift register device.

These and other objects of the invention will become apparent from the following description, taken together with the accompanying drawings, in which:

BRIEF DESCRIPTION OF THE DRAWINGS

In the figures, like reference characters refer to like parts.

DESCRIPTION OF THE PREFERRED EMBODIMENTS

Figure 1:
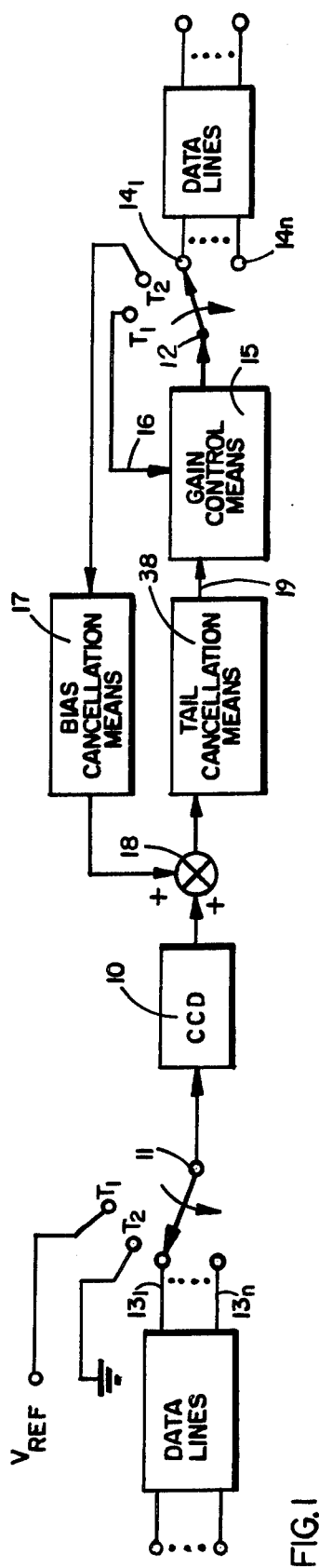
FIG. 1 is a block diagram of a system in which the concept of the invention is to be advantageously employed.

Referring now to FIG. 1, there is illustrated a block diagram of a system in which the concept of the invention is to be advantageously employed. There is provided a sample-and-hold device such as a charge coupled device type analog shift register 10 in cooperation with switches 11 and 12 for periodically sampling one or more data lines $13_1 \ldots 13_n$ and for providing an output sample to lines $14_1 \ldots 14_n$. Also associated with CCD structure 10 may be input signal conditioning circuitry (not shown), as is well understood in the art. A representative sample of an analog signal sampled from one of lines $13_1$-$13_n$ resembles a rectangular pulse, of the sampled amplitude, corresponding, for example, to curve 23 of FIG. 3. Ideally, the (delayed) output of device 10 in response to such input would be of the same shape. However, due to the charge device transfer inefficiency in effecting charge transfer or signal translation of a stored signal sample, the signal output tends to develop a "tail" or exhibit a smear, in the manner illustrated by curve 24 in FIG. 3. The output may also include a bias component and may further be subject to variations in gain or signal level.

Accordingly, there is further included in the arrangement of FIG. 1 apparatus for the correction of the above-noted signal distortions. There is provided first means 15 interposed in series with the throughput of shift register 10 for adjusting the signal level thereof in response to sample variations in the response of shift register 10 to a periodically injected signal reference source, $V_{REF}$. Such periodic injection is provided by means of the periodic cooperation of sampling switch 11 at periodic sampling time $T_1$ with the reference source, $V_{REF}$, and CCD 10. In synchronous cooperation with switch 11 is switch 12 which couples the output of gain control means 15 to a gain control input 16 thereof during the response of CCD 10 to $V_{REF}$ to effect the desired compensatory gain control function.

There is also included, in the arrangement of FIG. 1, second means 17 and 18 for compensatorily biasing the throughput of shift register 10 in response to sampled variations in the response of shift register 10 to a periodic nulling of the input of shift register 10. Such periodic nulling is provided by means of the periodic cooperation of sampling switch 11 with shift register 10 at periodic sampling time $T_2$ to ground or null the input thereof. In synchronous cooperation with switch 11, switch 12 couples the output of gain control means 15 to an input of bias cancellation means 17 during the response of shift register 10 to the applied null input. Any variation in the shift register output from a null, in response to the applied null input, is deemed indicative of the presence of a signal bias. Such bias is observed and remembered by element 17 and applied at signal combining means 18 in such sense as to effectively cancel such bias content in the output of CCD 10.

Figure 2:
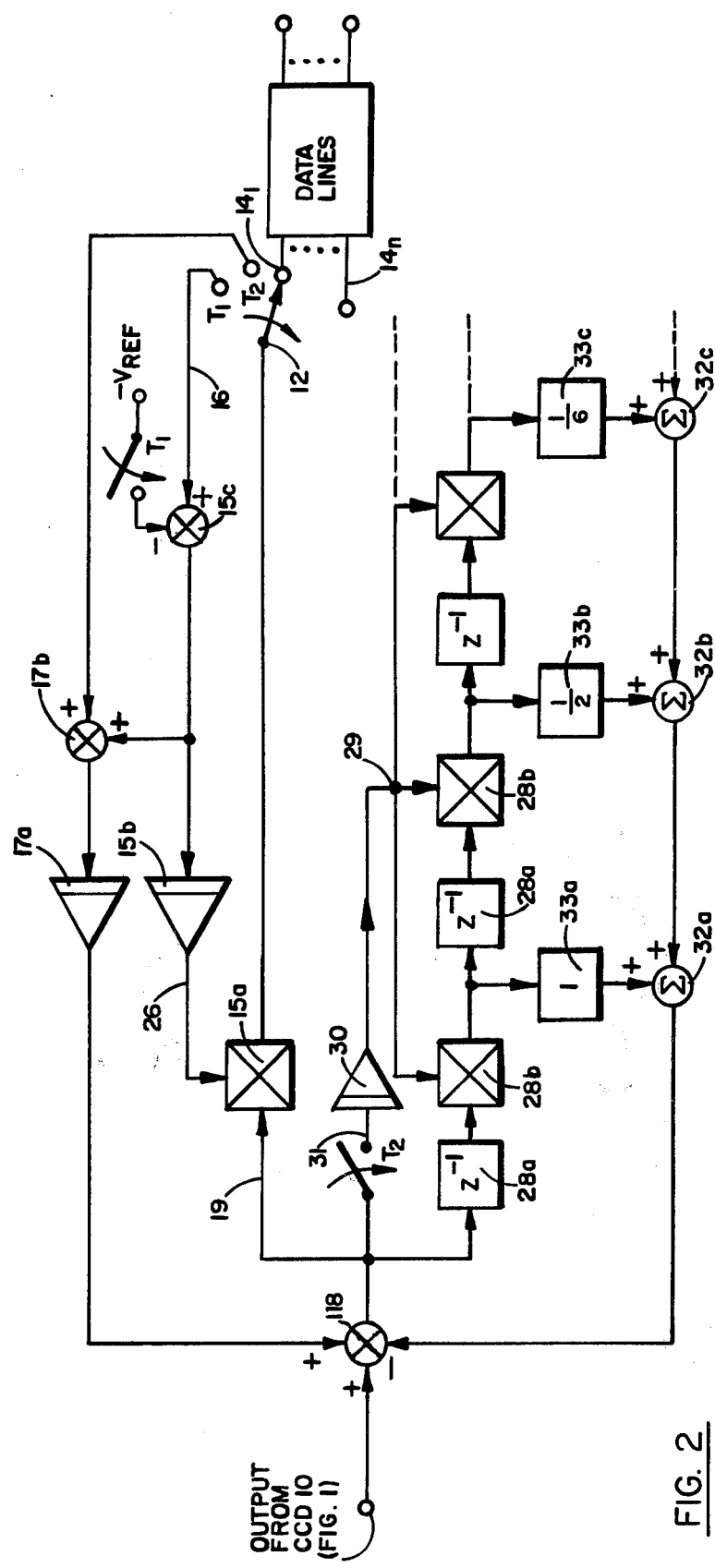
FIG. 2 is a schematic arrangement, partially in block form, of one embodiment of the inventive concept disclosed in FIG. 1 and employing a recursive filter.
Figure 3:
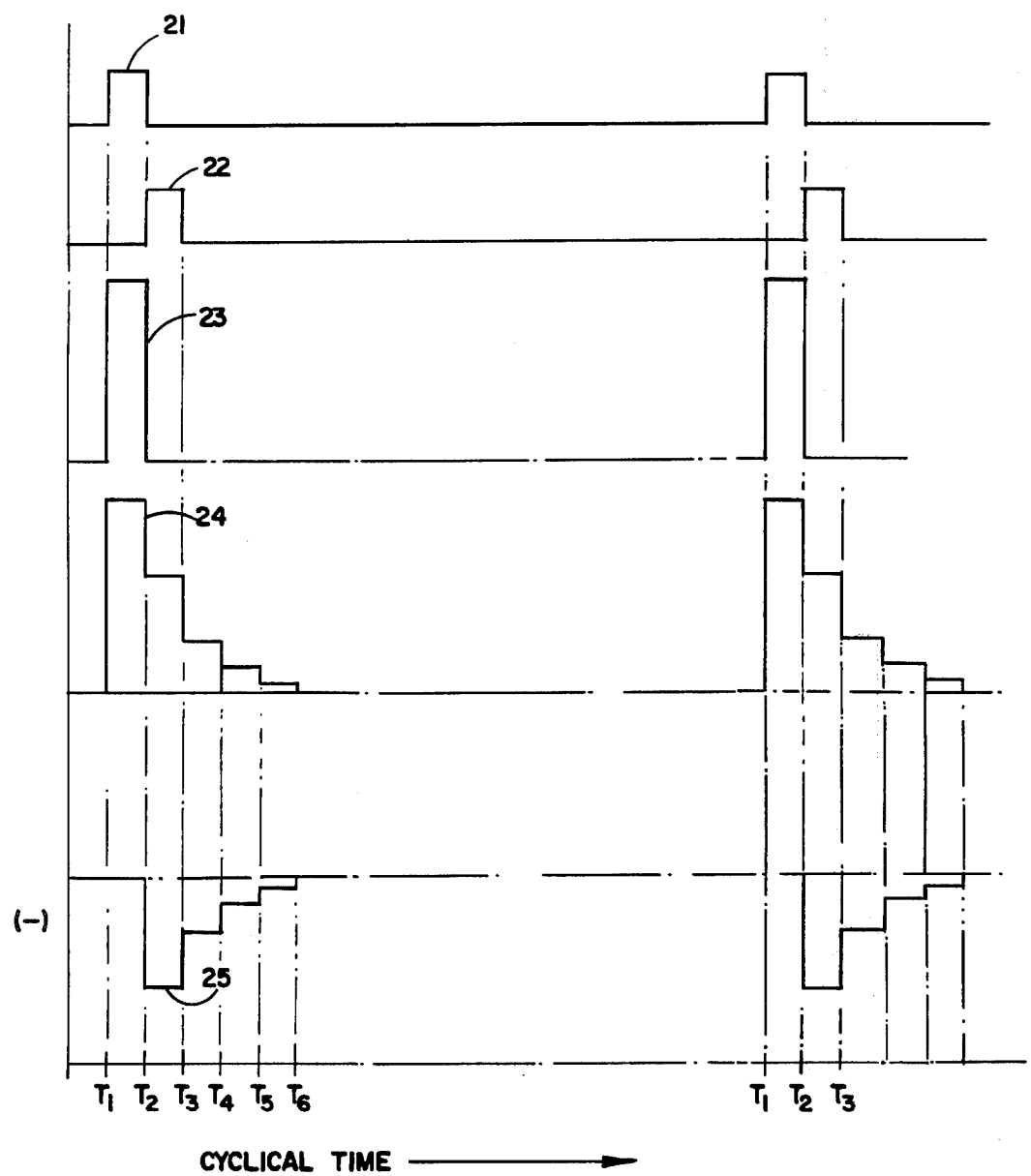
FIG. 3 is a family of time histories illustrating the response modes of several elements of the device illustrated in FIG. 2.

There is further included in the arrangement of FIG. 1 third means 38 interposed at the output of shift register 10 for cancelling the tail portion or smear in the output of CCD 10 and corresponding, for example, to that portion of curve 24 during the interval from $T_2$ to $T_6$ in FIG. 3. In other words, tail cancellation means 38 generates a preselectively delayed and modeled internal signal (curve 25 in FIG. 3) in response to the applied data smear (curve 24 in FIG. 3), which internal signal is so shaped and employed as to cancel the signal tail or data smear. Tail cancellation means 38 comprises one of a recursive and transversal type network having a gated gain control input periodically coupled to the output of the shift register 10 during the response thereof to the above-noted applied null input, as is more clearly shown in FIGS. 2, 4, 5 and 6.

Referring now to FIG. 2, there is shown in fuller detail a mechanization of the inventive concept of FIG. 1 and in which an adaptive recursive type filter is employed. Shown is signal combining means 118 in cooperation with an integrator 17a, corresponding to the memory function of element 17 in FIG. 1. In other words, the bias output maintained by integrator 17a is changed or adjusted only in response to an applied (non-null) input thereto (at $T_2$). There is also included in FIG. 2 a signal multiplier 15a interposed between element 118 and switch 12 and having a gain control input 26 coupled to the output of an integrator 15b. Integrator 15b has a switched summing input 15c differentially responsive to reference voltage $V_{REF}$ and the switched output of signal multiplier 15a at cyclical switching time $T_1$. Thus, integrator 15b responds only to the sampled difference between the gain-multiplied output of CCD 10 and the reference voltage (during the response of CCD 10 to the applied input of $V_{REF}$ to CCD 10, as shown in FIG. 1), to compensatorily adjust the gain control input maintained at multiplier 15a in such sense as to reduce the difference. In this way, a constant or calibrated gain level is maintained, and elements 15a, 15b and 15c of FIG. 2 are seen to correspond to element 15 of FIG. 1.

An adaptive recursive filter is also included in FIG. 2, being comprised of like tandem sets of a sampling delay element 28a and multiplier 28b, tandemly input coupled to the output of signal combining means 118. The gain control inputs of multipliers 28b are commonly connected via terminal 29 to the output of a signal integrator 30 having a switched input 31. Switched input 31 of gain control integrator 30 is coupled to the output of signal combining means 118 during the interval of response $T_2$ of CCD 10 to an applied null input. (See $T_2$ position of sampling switch 11 in FIG. 1.) Thus, the gain control output maintained by integrator 30 is adjusted only in response to a non-null or imperfect null input thereto during periodic sample time $T_2$. The output of each tandem-connected pair of elements 28a and 28b is additionally fed to signal combining means 32a, 32b and 32c and employed as a negative feedback signal at signal combiner 118. Interposed between the output of each said pair of tandem elements 28a and 28b and the associated input to the summing means 32a, 32b and 32c is gain weighting means 33a, 33b and 33c, the relative gain-weighting values N thereof for successive ones n of the tandem pairs or sets of filter sections progressing as an inverse factorial progression (i.e., $N = 1/n! = 1$, $\frac{1}{2}!$, $\frac{1}{3}!$, or 1/6, etc.). Although the recursive filter thus described has been illustrated as being comprised of only three filter sets, it is to be understood that a larger number may be employed. However, because the gain-weighted progression described above reduces the contributions of successive sections, it has been found that highly useful results can be obtained with only three sets of filter sections.

In the feedback arrangement of element 38 of FIG. 1, as depicted in detail in FIG. 2, signal combining means is required to differentially combine the outputs of element 18 and element 32a. However, rather than employ a separate additional signal combiner for such function, the detail mechanization of FIG. 2 combines such function and that of element 18 within a single signal-combiner 118 for purposes of engineering economy, as is well understood to those skilled in the art.

Although the adaptive recursive filter of FIG. 2 has been illustrated as employing relative gain-weighting at the feedback summing points in an inverse factorial progression, the concept of the invention is not so limited and any equivalent means of effecting the desired filter response may be employed. For example, appropriate progressive gain-weighting may be alternatively applied by insertion in the feed-forward path or inclusion in the scaling of each of the successive sets of elements in tandem, an inverse arithmetical progression (i.e., $N = 1/n = 1, \frac{1}{2}, \frac{1}{3}$, etc.) of gain-weighting for such tandem gain-weighted arrangement in FIG. 4 being the equivalent of the inverse factorial progression employed in the gain-weighting arrangement of FIG. 2.

Figure 4:
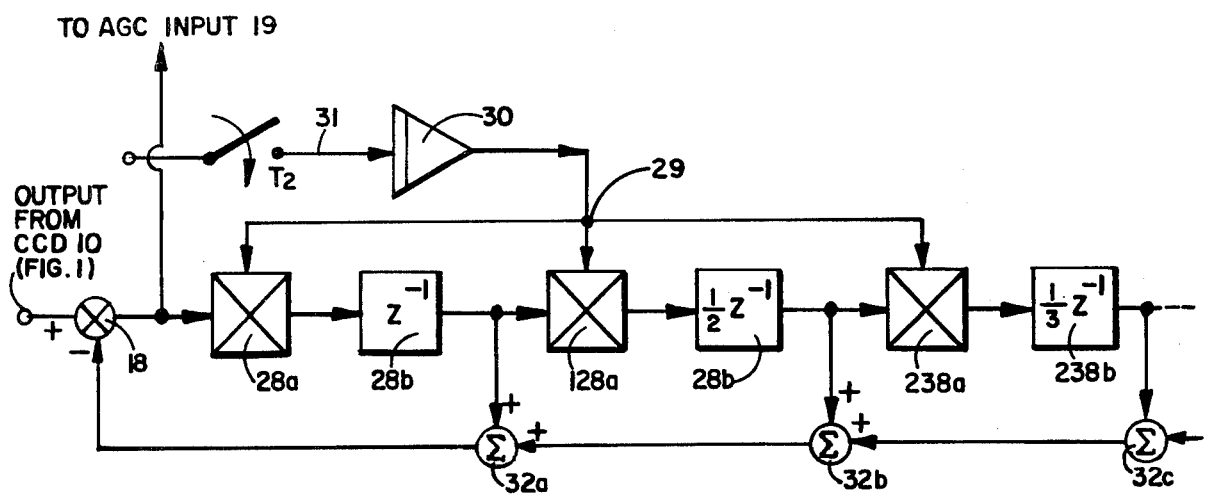
FIG. 4 is an alternate arrangement of the recursive filter of FIG. 2.
Figure 5:
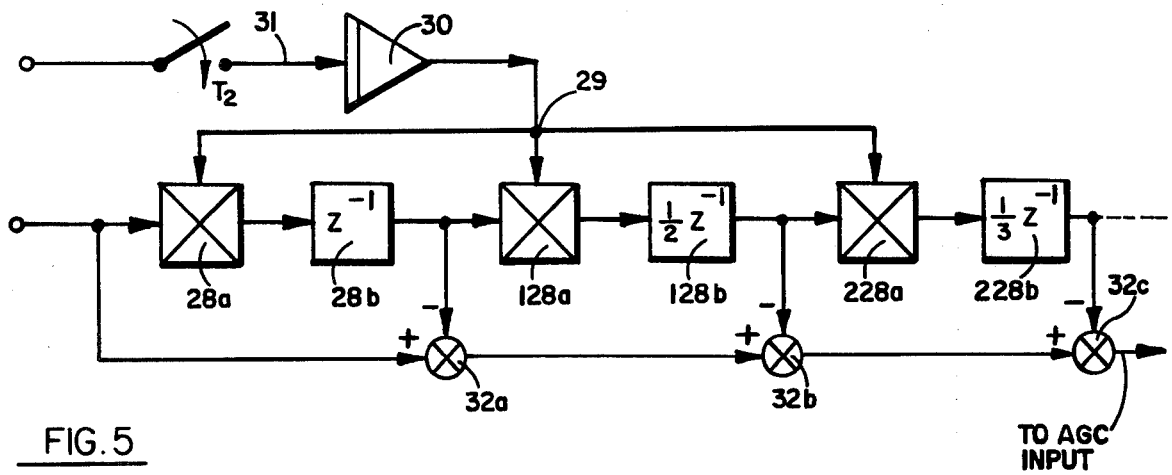
FIGS. 5 and 6 are alternate transversal filter arrangement which may be substituted for the recursive filter of FIGS. 2 and 4.
Figure 6:
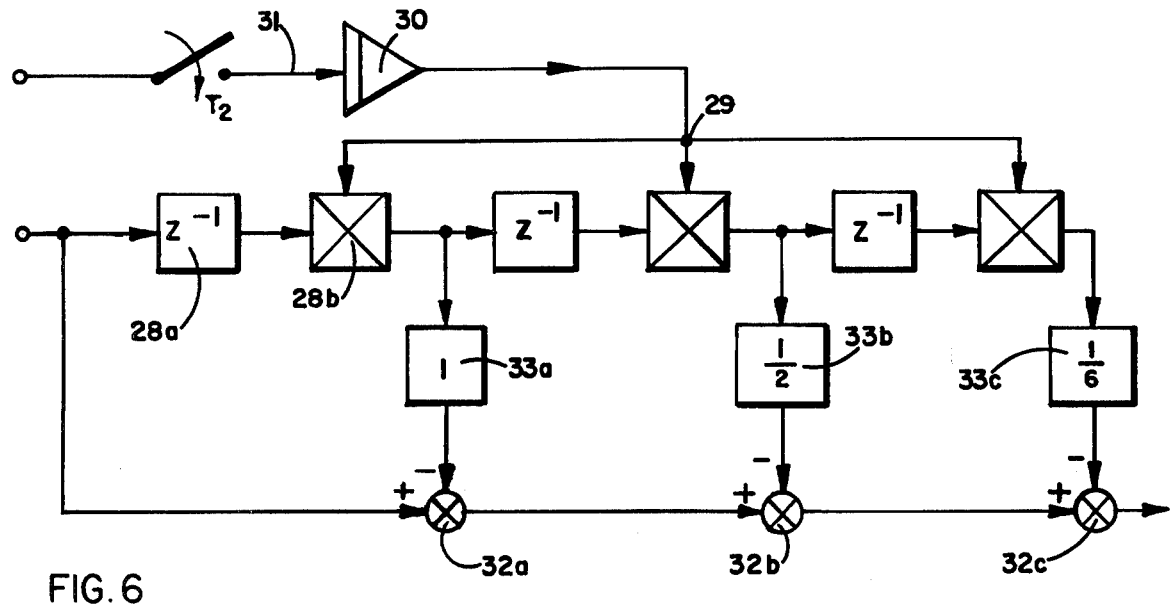

Further, although the tail cancellation means 38 of FIG. 1 has been illustrated in FIGS. 2 and 4 as comprising an adaptive recursive type filter, the concept of the invention is not so limited, and a suitably gain-weighted adaptive transversal filter may be alternatively employed, utilizing the same relative gain-weighting progressions as those employed in the recursive filter embodiment, as shown in FIGS. 5 and 6.

Although the several discrete circuit elements of the figures have been shown in block form, the construction, arrangement and cooperation thereof are well understood to those skilled in the art, as indicated by reference to U.S. Pat. No. 4,038,536 for Adaptive Recursive Least Mean Square Error Filter, issued to Paul L. Feintuch, assignor to Rockwell International Corporation, assignee of the subject invention.

In normal operation of the device of FIG. 2 or any of the above-described alternative arrangements thereof, sequential switching signals generated by electronic clocking means well understood in the art will synchronously operate stepping switches 11 and 12, to sequentially step or switch to an AGC sample mode ($T_1$), a bias control mode ($T_2$) (which latter mode is also employed to adaptively adjust the gain channel of the tail-cancelling filter 38, and successive ones of a plurality of sampled signal lines in the successive sampling intervals corresponding to the sequential switching of successive sampled data line sets $13_1$-$14_1$, $13_2$-$14_2$, . . . $13_n$-$14_n$. Referring to the family of time histories in FIG. 3, curve 21 at time $T_1$ represents a $T_1$ sampling signal for switches 11 and 12 (in FIG. 1) and the switched input to element 15c (in FIG. 2), while curve 22 at time $T_2$ represents a $T_2$ sampling signal for switches 11 and 12 (in FIG. 1) and the switched input to integrator 30 (in FIG. 2). Similarly, subsequent sampling control signals (by clock means not shown but well understood in the art) would effect control of the sampling of the sampled data lines by sampling switches 11 and 12.

By superposition, tail portions of a prior data sample may be present in the read-out of subsequent data samples. However, similarly by means of superposition, the tail cancelling filter serves to correctly cancel each contribution made by each sampling of the data.

Referring again to FIG. 2, there is further included in the structure for bias cancellation means 17b for reducing the response to gain-variations in a gain-scaled bias signal component. Such means 17b comprises signal combining means for insertion of the gated gain-error signal from element 15c as an additional sampled input to integrator 17a. In this way, performance of the bias compensation loop may be allowed to converge more quickly and independently of system gain errors.

Accordingly, there has been described means for improving the performance of CCD-type analog shift registers by compensation of the data smear or signal distortion normally induced by charge transfer inefficiency. Although the invention has been disclosed and illustrated in detail, it is to be clearly understood that the same is by way of illustration and example only and is not to be taken by way of limitation, the spirit and scope of this invention being limited only by the terms of the appended claims.

I claim:

1. A device for the correction of signal tail distortion occurring in an analog sampling shift register and comprising one of a recursive and transversal type filter having a gain control input responsive to an output of said shift register during the response thereof to an applied null input, said filter further having an input means responsive to said output of said shift register for preselective shaping of said shift register output response to compensate for tail-end data smear of signal samples sampled by said shift register.

2. The device of claim 1 in which said filter is comprised of a recursive filter having relative gain-weighted successive filter sections, the relative gain-weightings of successive sections progressing as an inverse arithmetical progression, a combined sum of the gain weighted outputs of said successive sections being supplied as a negative feedback signal to said signal-shaping filter input means.

3. The device of claim 1 in which said filter is comprised of a transversal filter having gain-weighted successive filter sections, the relative gain-weighting of successive sections progressing as an inverse arithmetic progression, the outputs of said gain-weighted filter sections being combined and fed as an output of said filter.

4. The device of claim 1 in which said filter is comprised of a recursive filter having gain-controlled successive filter sections, the outputs of which sections being combined after relative progressive gain-weighting thereof and the signal combination supplied as a negative feedback signal to said signal-shaping filter input, such gain-weighting progressing as an inverse factorial progression.

5. The device of claim 1 in which said filter is comprised of a transversal filter having gain-controlled successive filter sections, the outputs of such sections being combined after relative progressive gain-weightings to provide an output of said filter, said gain-weighting progressing as an inverse factorial progression.

6. The device of claim 1 in which there is further provided gain compensation means responsively coupled to the output of said filter for compensatorily adjusting the signal level thereof in response to output variations thereof to a sampled signal reference source periodically injected at an input of said shift register.

7. The device of claim 6 in which there is further provided means for compensatorily biasing the output of said shift register in response to variations thereof to a periodic nulling of the input of said shift register.

8. The device of claim 1 in which there is further provided means for compensatorily biasing the output of said shift register in response to variations thereof to a periodic nulling of the input of said shift register.

9. A device for the correction of signal distortion occurring in an analog sampling shift register and comprising in combination first means interposed in series with a throughput of said shift register for compensatorily adjusting the signal level thereof in response to sample variations in the response thereof to a periodically injected signal reference source, second means for compensatorily biasing the throughput of said shift register in response to sampled variations in the response thereof to a periodically nulling of the input of said shift register, and third means interposed at an output of said shift register and comprising one of a recursive and transversal type network having a gated gain control input periodically coupled to the output of said shift register during the response thereof to said null signal reference for compensatorily biasing said output of said shift register.

10. The device of claim 9 in which the input of said second means is further responsive to sampled variations in the output of said first means in such sense as to reduce the response of said second means to variations in the signal level adjustment of said signal level adjusted shift register response.

11. The device of claim 9 in which said second means is comprised of signal combining means interposed at an output of said shift register, and a signal integrator having an output coupled to an input of said signal combining means and having an input responsive to the output of said first means during response of said shift register to periodic nulling of the shift register input, whereby the output of said signal combining means is compensatorily biased in such a sense as to provide a null output during said periods of shift register response to said periodic nulling.

12. The device of claim 11 in which said input of said signal integrator of said second means is further coupled to the input of said integrator of said first means in a sense whereby the bias response of said second means to variations in said multiplier gain is reduced.

13. The device of claim 9 in which said first means is comprised of
 a signal multiplier having a first input responsive to an output of said third mentioned means, and
 a signal integrator having an output coupled to a second input of said multiplier and further having an input responsive to the sampled difference between said signal reference source and an output of said multiplier for adjusting the gain of said multiplier in such sense as to reduce said difference.

14. A device for the correction of signal distortion occurring in an analog sampling shift register and comprising in combination:
 gain compensation means interposed at an output of a shift register and comprising
  a voltage reference source for periodic sampling by said sampling shift register,
  a multiplier interposed between an output of said shift register and a set of sampling signal output lines for gain-scaling the output of said shift register, the gain scaled output of which multiplier is periodically compared to said reference source for generation of a gain control input to said multiplier as a function of said comparison,
 bias cancellation means interposed at said output of said shift register and comprising
  a null signal reference to be periodically sampled by said shift register,
  compensatory bias signalling means having an input coupled to an output of said multiplier during the shift register periodic output response to said sampled null signal reference for cancelling a bias signal component of said shift register response; and
 tail cancellation means interposed at said output of said shift register and comprising one of a recursive and transversal type network having a gated gain control input periodically coupled to the output of said shift register during the response thereof to said null signal reference for compensatorily biasing said output of said shift register.

* * * * *